(12) United States Patent
Mysore Rajagopal et al.

(10) Patent No.: US 11,527,530 B2
(45) Date of Patent: Dec. 13, 2022

(54) ELECTROSTATIC DISCHARGE PROTECTION SYSTEM

(71) Applicant: TEXAS INSTRUMENTS INCORPORATED, Dallas, TX (US)

(72) Inventors: Krishna Praveen Mysore Rajagopal, Sunnyvale, CA (US); James Paul DiSarro, Allen, TX (US); Ann Margaret Concannon, Palo Alto, CA (US); Rajkumar Sankaralingam, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/321,492

(22) Filed: May 16, 2021

(65) Prior Publication Data
US 2022/0223581 A1    Jul. 14, 2022

Related U.S. Application Data

(60) Provisional application No. 63/136,875, filed on Jan. 13, 2021.

(51) Int. Cl.
*H01L 27/02* (2006.01)
*H02H 9/04* (2006.01)

(52) U.S. Cl.
CPC ...... *H01L 27/0266* (2013.01); *H01L 27/0259* (2013.01); *H02H 9/046* (2013.01)

(58) Field of Classification Search
CPC .. H01L 27/0266; H01L 27/0259; H02H 9/046
USPC .......................................................... 361/56
See application file for complete search history.

(56) References Cited

U.S. PATENT DOCUMENTS

| | | | | |
|---|---|---|---|---|
| 5,745,323 | A * | 4/1998 | English | H03K 19/00315 361/111 |
| 7,408,754 | B1 * | 8/2008 | O | H01L 27/0262 361/91.1 |
| 8,116,052 | B2 * | 2/2012 | Nakahara | H03K 17/0822 361/91.7 |
| 8,693,148 | B2 * | 4/2014 | Chaine | H01L 27/0262 361/111 |
| 2003/0043523 | A1 * | 3/2003 | Hung | H02H 9/046 361/111 |
| 2010/0118456 | A1 * | 5/2010 | Yamadaya | H01L 27/0251 361/56 |
| 2014/0355157 | A1 * | 12/2014 | Huang | H02H 9/041 361/56 |
| 2021/0013714 | A1 * | 1/2021 | Huang | H02H 9/046 |

* cited by examiner

*Primary Examiner* — Dharti H Patel
(74) *Attorney, Agent, or Firm* — Andrew R. Ralston; Charles A. Brill; Frank D. Cimino

(57) ABSTRACT

An ESD protection system including structure to operate an IC during nominal conditions, to protect the IC during an ESD event, and to allow the IC to operate during slow rising input node voltages that exceed nominal conditions.

30 Claims, 4 Drawing Sheets

ELECTROSTATIC DISCHARGE PROTECTION SYSTEM

CROSS-REFERENCE TO RELATED APPLICATION

This application claims the benefit of and priority to U.S. Provisional Application No. 63/136,875, filed Jan. 13, 2021, which is hereby fully incorporated herein by reference.

BACKGROUND

The example embodiments relate to electrostatic discharge (ESD) protection.

ESD is the sudden flow of electricity between two objects as electrical charge transfers from one of the objects to the other. For integrated circuit (IC) durability and longevity, ESD protection is sometimes included and applied to an IC circuit or IC node. The ESD protection prevents IC damage that could occur in response to an ESD pulse that is applied to the IC. Typically, the ESD protection is designed to shunt energy away from the IC during an ESD event, but an errant ESD clamp at a time when ESD is not occurring also can cause damage, either to the ESD-protected circuit or other circuitry connected to that circuit. This document provides example embodiments that may improve on certain of the above concepts, as detailed below.

SUMMARY

In one example embodiment, there is an ESD protection system. The system comprises a first signal node adapted to receive a signal, a reverse breakdown device coupled to the first signal node, and a slew rate response circuit coupled to the first signal node. A first selectively switched conductive device is coupled between the reverse breakdown device and a low potential node adapted to receive a low potential. A controllable voltage source is coupled to the selectively switched conductive device. And, a second selectively switched conductive device is coupled between the first signal node and the low potential node, the second selectively switched conductive device further coupled to receive a controlling voltage from the controllable voltage source.

Other aspects and embodiments are also disclosed and claimed.

DETAILED DESCRIPTION

Figure 1:
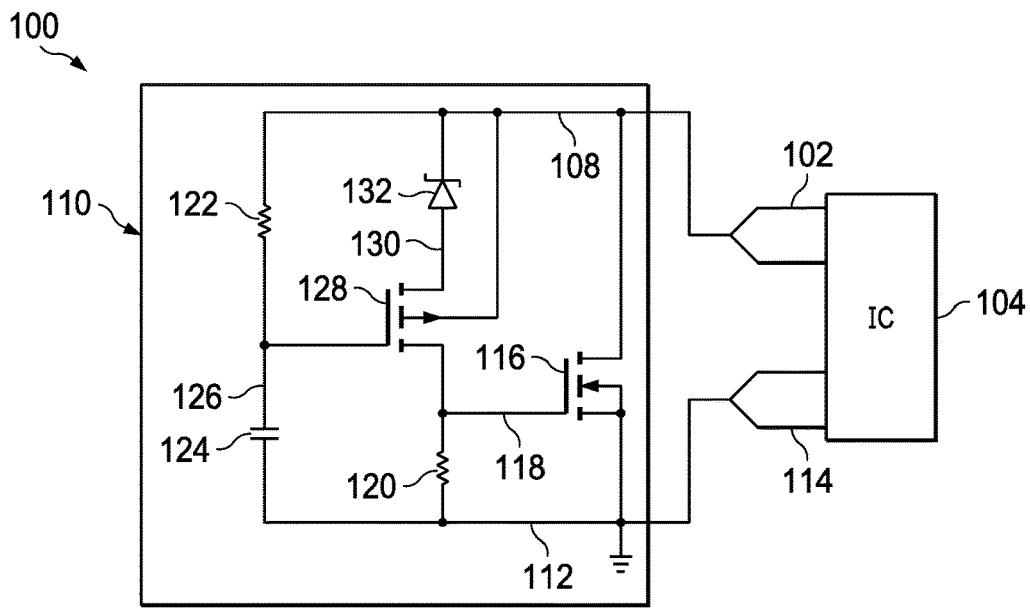
FIG. 1 illustrates an electrical diagram of an ESD protection system.

FIG. 1 illustrates an electrical diagram of an ESD protection system 100. The ESD protection system 100 includes a first node 102 that is ESD protected. As an example, the first node 102 is connected to an IC 104, and more particularly for example as an input and/or output ("input/output") pad of the IC 104. The first node 102 may represent an internal conductive point of the IC 104, or an external conductive point of the IC 104 including a pin. The IC 104 may be any type of circuit, for example in a relatively high voltage device or environment, and it includes circuitry and functionality as are typically described in a specification for the IC. The IC 104 may be of a type, or used in an application, for which it is expected that the first node 102 may experience ESD events. Additionally, however, the first node 102 may experience excess signal (e.g., voltage) conditions beyond nominal specification but that are not from ESD events, where such signaling can be from manufacturer-applied voltage stress testing or one-time programming. As further detailed later, the ESD protection system 100 endeavors to shunt energy to protect the IC 104 during an ESD event, but does not enable the shunting functionality during certain non-ESD excess signaling.

The first node 102 is also connected to an input node 108 of an ESD protection circuit 110. The ESD protection circuit 110 may be an external device or circuit relative to the IC 104 or may be integrated internally within a same boundary (e.g., a same die or package) as the IC 104. The ESD protection circuit 110 provides, or is connected to, a common low potential node 112, connected for example to ground. The common low potential node 112 is also connected to a low potential pad 114 of the IC 104.

Within the ESD protection circuit 110, an N-type metal-oxide-semiconductor (NMOS) field-effect transistor (FET) 116 has a drain connected to the input node 108, a source and body connected to the common low potential node 112, and a gate connected to a first internal node 118. A first resistor 120 is connected between the first internal node 118 and the common low potential node 112. A series resistor/capacitor (RC) impedance is connected between the input node 108 and the common low potential node 112, including a second resistor 122 and a capacitor 124, with a second internal node 126 between the second resistor 122 and the capacitor 124. The resistance of the second resistor 122, and the capacitance of the capacitor 124, are together selected so that the RC time constant, $\tau(RC)$, which is the product of that resistance and capacitance, provides a sufficiently long period for the capacitor 124 to charge, through the second resistor 122, to ensure desired operation described later. By way of numeric example, assume that $\tau(RC)=30.0$ µs, although such an example may be modified based on various considerations as are further evident from the remainder of this document, such as the duration of $\tau(RC)$ relative to the duration of an ESD event. In that regard, $\tau(RC)$ may in some instances be comfortably reduced, which can reduce the resistance of the resistor 122, and/or the capacitance of the capacitor 124, thereby reducing the area needed for one or both of those devices. The second internal node 126, charged at the rate of $\tau(RC)$, is connected to the gate of a P-type metal-oxide-semiconductor (PMOS) FET 128. The PMOS FET 128 has a source connected to a third internal node 130, a drain connected to the first internal node 118, and a body connected to the input node 108 which reduces a possibility of any floating nwell in the PMOS FET 128 that otherwise might cause parasitic effects. A Zener diode 132 has an anode connected to the third internal node 130 and a cathode connected to the input node 108. In an example embodiment, the Zener diode 132 is chosen so that its breakdown voltage, that is the voltage at which it will conduct in the reverse direction due to a breakdown of its internal PN junction, is above the nominal operating voltage at the first node 102. For example, if the IC 104 operates at a nominal supply or data signal of 5V, then the Zener diode 132 may have a breakdown voltage of 6V.

Figure 2:
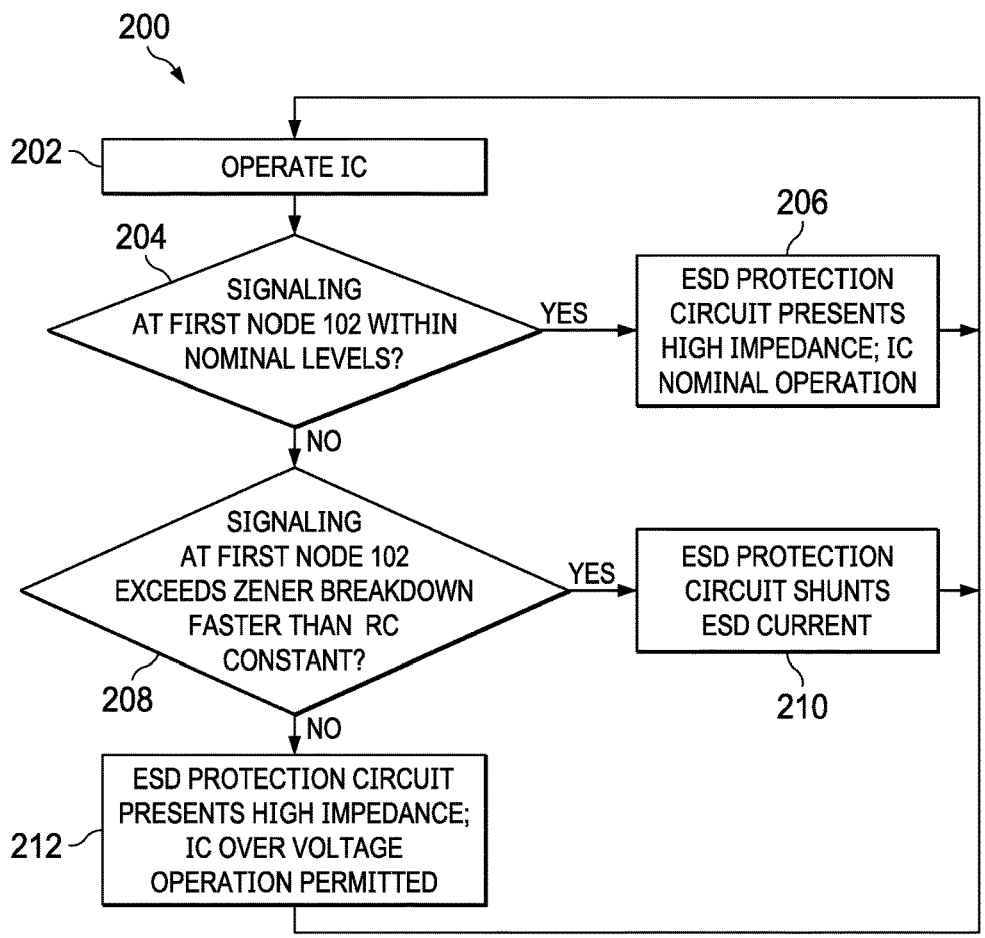
FIG. 2 illustrates a flowchart of an operational method illustrating the operation of the FIG. 1 ESD protection system.

FIG. 2 illustrates a flowchart of an operational method 200 of the FIG. 1 ESD protection system 100. In a step 202, the IC 104 operates according to its functionality and specifications, including receiving signaling at the first node 102. The responsive ESD protection circuit 110 operation, that is whether as ESD shunt is triggered, depends on a conditional step 204, which includes at least one trigger condition as the signaling level at first node 102 (and by connection the input node 108). Particularly, if the first node 102 signaling is within nominal levels, then the method 200 proceeds from step 204 to a step 206. In the ESD protection system 100, for example, such a condition occurs when the first node 102 is at or below its nominal operational voltage (e.g., 5V). If the first node 102 signaling is above nominal levels, then the method 200 proceeds from step 204 to a step 208, where at least one additional trigger condition determines whether an ESD shunt is triggered.

Step 206 is reached when the first node 102 signaling is within nominal levels, that is, below that where the IC 104 requires ESD protection. In response, the ESD protection system 100 presents a relatively high impedance, approximating an open circuit, between the first node 102 and the low potential pad 114. More particularly, because the voltage at the first node 102 is at or below nominal level, then that same voltage is coupled to the input node 108, and it is insufficient to break down the Zener diode 132 (despite the rise time of the voltage). Additionally, the voltage at the input node 108 also couples to the second internal node 126, turning off the PMOS FET 128. Accordingly, no current can flow through the Zener diode 132 to or through the PMOS FET 128, and likewise no current flows through the first resistor 120. As a result, the voltage across the first resistor 120 is negligible or zero, and that negligible or zero voltage is connected to the gate of the NMOS FET 116. Accordingly, in the step 206 the NMOS FET 116 is not enabled and does not conduct current. From the above, the ESD protection circuit 110 does not provide a low resistance conductive path to shunt any charge during the step 206, so operation of the IC 104 is according to its nominal parameters and functions and without material impact from the ESD protection circuit 110. Lastly, the operational method 200 is an ongoing process when the IC 104 is on, so FIG. 2 illustrates a line returning from step 206 to step 200, as the signaling condition at the first node 102 continues to determine whether ESD protection of the IC 104 is triggered.

Step 208 represents a conditional analysis when the first node 102 signaling exceeds the nominal operation of the IC 104. The step 208 depends on two conditions of the first node 102 signaling: (1) the signal magnitude; and (2) the signal slew rate, that is, the rate at which the signal changes. Particularly, recall first node 102 signaling is coupled to both the Zener diode 132 cathode and to the series RC combination of the second resistor 122 and the capacitor 124. Accordingly, as to the Zener diode 132, when first node 102 voltage exceeds the Zener breakdown voltage, then the Zener diode 132 will conduct, provided its anode has a coupling to a lower potential, such as to the common low potential node 112. This potential coupling to a lower potential is through the PMOS FET 128, but the conductive path through the PMOS FET 128 depends on its gate voltage, which is provided by the second internal node 126. The voltage at that second internal node 126 is between the second resistor 122 and the capacitor 124 and therefore depends on τ(RC), as provided from those two devices. From the preceding, and further presented following the step 208, the step 208 is conditioned on whether the first node 102 signaling slew rate exceeds the Zener diode 132 breakdown either faster or slower than τ(RC). If faster (a first slew rate), then method 200 proceeds from the step 208 to a step 210; if slower (a second slew rate), then method 200 proceeds from the step 208 to a step 212.

Figure 3:
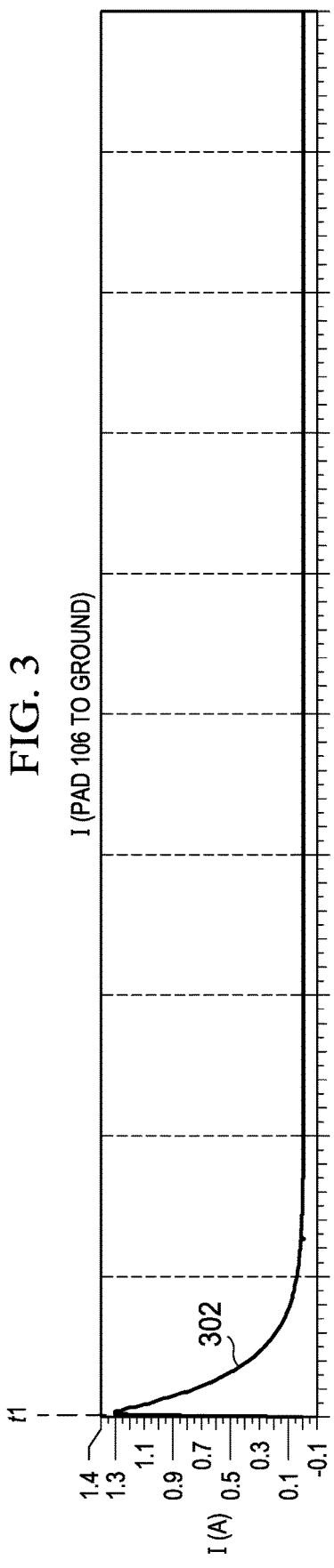
FIG. 3 illustrates a current and voltage plot during a shunting operation of the FIG. 1 ESD protection system.
Figure 3:
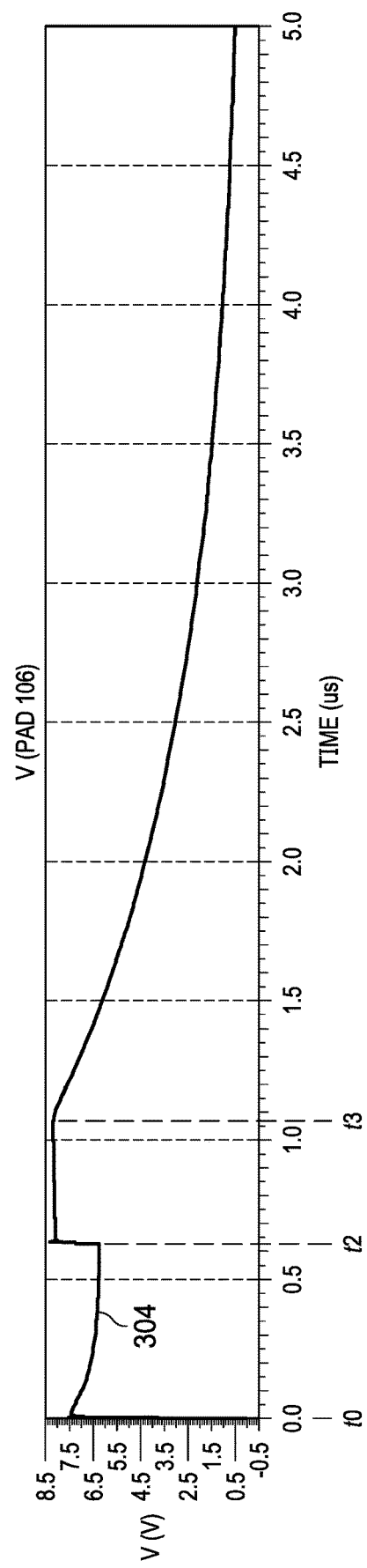

The step 210 is now described and is partially illustrated by way of example in FIG. 3. Specifically, FIG. 3 illustrates a current plot 302, of current (in Amps) from the first node 102 to ground, and a voltage plot 304, of voltage (in volts) at the first node 102, both with respect to time (in microseconds; μs). In the step 210, the PMOS FET 128 is enabled due to a low potential at its gate. Further, in response to the voltage at the first node 102 rising to or above the Zener diode 132 breakdown, and with the rise time being at a first slew rate faster than τ(RC), the Zener diode 132 breaks down as there is a conductive path from it, through the enabled PMOS FET 128 and the first resistor 120, to the common low potential node 112. Accordingly, a current path is provided from the first node 102 to the common low potential node 112. The preceding events are illustrated in FIG. 3, starting at time t0. Particularly, the voltage plot 304 illustrates a fast voltage ascent (spike) starting at t0, where the voltage slew rate increase is a very small portion of even the first 0.05 μs illustrated. Assume, for the FIG. 3 example, that the illustrated voltage spike rise time is 0.01 μs, while assume also that τ(RC) is at least four to five times longer, although note here that τ(RC) is conservatively much longer (orders of magnitude longer) in the earlier-provided example of τ(RC)=30 μs. In response to the first node 102 rising voltage, and it being relatively faster (e.g., four to five times, or even an order of magnitude) than τ(RC), the above-described enabled conductive path operates to shunt a current spike, as shown in the current plot 302 from t0 to t1, from the first node 102 to the common low potential node 112. From the above, the combined elements of the ESD protection circuit 110 operate to clamp the fast rising voltage at the Zener diode 132 breakdown voltage, and shunt the resultant current, while preventing the impact of such signals from negatively impacting (e.g., damaging) the IC 104.

The remainder of FIG. 3 also illustrates the additional settling of signals after the initial spike has been shunted. Specifically, the voltage plot 304 remains high for the remainder of the ESD event, for approximately 1.2 μs, ending at t3. Before then, at t2 (approximately 0.6 μs), the current plot 302 reaches a (low) level at which the voltage across the first resistor 120 is insufficient to keep the NMOS FET 116 on (referred to as falling below the holding current), so it turns off the NMOS FET 116, thereby opening the conductive path through the ESD protection circuit 110. Accordingly, the shunted current through the NMOS FET 116 remains low in FIG. 3 following t2. However, because τ(RC)=30 μs which is a relatively long time period compared to that in FIG. 3, then the voltage at the second internal node 126 is not charged at the much earlier time of t2, or for the entire duration shown in FIG. 3, so the PMOS FET 128 remains on for the entire FIG. 3 duration, and at t2, voltage remains across the combination of that PMOS FET 128, the clamped breakdown voltage of the Zener diode 132, and the first resistor 120. Also at t2, with much of the ESD charge having been dissipated as shown by the decline in the current plot 302, some residual charge remains that is insufficient to enable the NMOS FET 116 but dissipates relatively slowly, as shown by the slight rise in the voltage plot 304 at t2. This combined voltage persists until t3, after which it decays toward zero. Lastly, following the above sequence, the method 200 returns from the step 210 to the step 202, in which the IC 104 operates normally, having been protected by the ESD protection circuit 110 from the ESD event.

Figure 4:
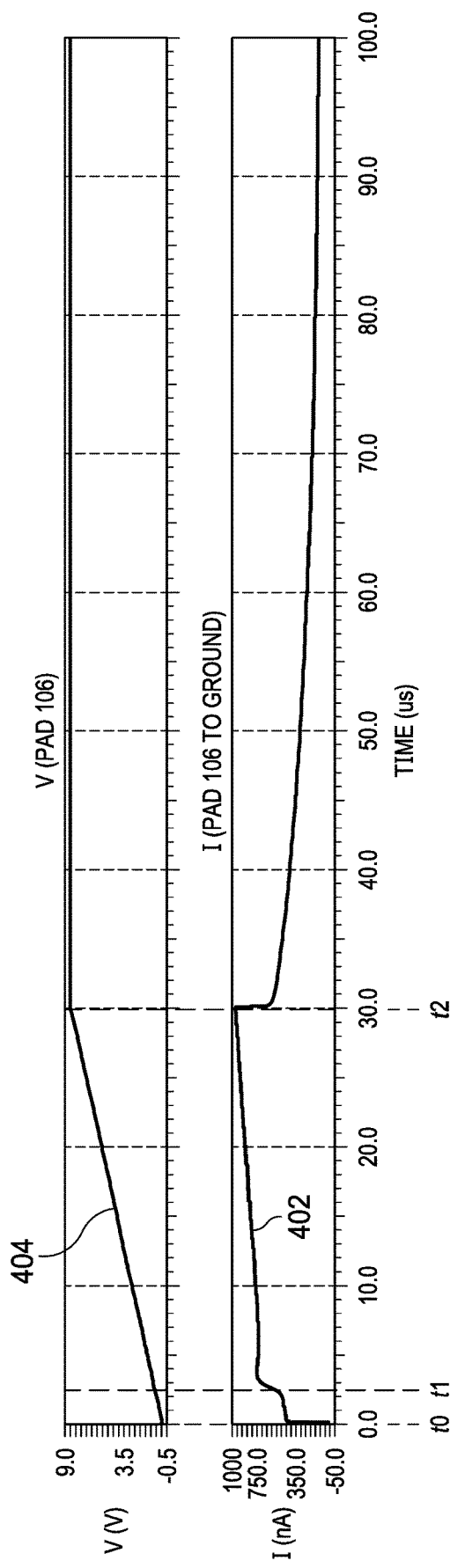
FIG. 4 illustrates a current and voltage plot during an over voltage operation of the IC in the FIG. 1 ESD protection system.

The step 212 is now described and is partially illustrated by way of example in FIG. 4. Specifically, FIG. 4 illustrates a current plot 402, of current (in nanoamps; nA) from the first node 102 to ground, and a voltage plot 404, of voltage (in volts) at the first node 102, both with respect to time (in microseconds; μs). The voltage plot 404 illustrates 8V on the first node 102 at t2, but that voltage magnitude is reached only after a second slew rate ascent from 0V at t0, to 8V at t2, and that ascent occurs over approximately 30 μs. Accordingly, the approximate 30 μs voltage slew rate ascent in the FIG. 4 voltage plot 404 is much slower than the approximate 0.01 μs ascent of the ESD event shown in the FIG. 3 voltage plot 304. From the earlier discussion of the slew-rate dependency in the preceding step 208, note that the relatively slow ascent of the voltage plot 404 provides time for the RC combination of the second resistor 122 and the capacitor 124 to charge the FIG. 1 second internal node 126, that is, the voltage ascent time approximates the τ(RC)=30 μs of those devices. Further, as the RC combination charges, at t1 the voltage at the second internal node 126 reaches a sufficiently positive value (e.g., 0.7V) that disables the PMOS FET 128, thereby isolating the Zener diode 132 from the common low potential node 112. With the Zener diode 132 so isolated, the path for it to potentially break down is removed. Accordingly, as the voltage plot 404 continues its ascent from t1 to t2, there are at least two distinctions from the earlier operation where the breakdown is possible: (i) with the PMOS FET 128 disabled, there is no low resistance conductive path from the Zener diode 132 to the first resistor 120 and, accordingly at most negligible current through the first resistor 120; and (ii) with little or no current through the first resistor 120, there is at most negligible voltage applied to the gate of the NMOS FET 116, so it remains off. Summarizing, during the entire relatively slow FIG. 4 voltage ascent, the shunting capability of the ESD protection circuit 110 is selectively disabled, as a result of that ascent being equal to or longer in duration than τ(RC). Accordingly, and as shown in the FIG. 4 current plot 402, the current through the ESD protection circuit 110 remains relatively low (e.g., less than 1,000 nA).

With the ESD shunting capability of the ESD protection circuit 110 selectively disabled in the step 212, the IC 104 signaling is unaffected and the IC 104 is able to operate according to its nominal functionality. This result can advantageously facilitate at least two different example IC environments. As a first IC example environment, over voltage stress testing (OVST) is a testing process sometimes used in connection with IC manufacture. During OVST, higher-than-nominal voltage (e.g., 160% of nominal pad/pin voltage) is applied to the IC over an extended period of time, in order to stress portions of the IC, such as gate oxides, to evaluate the long-term viability of those stressed portions. The higher voltage is intended to simulate a longer period of time, so that an IC that fails the OVST can be identified as one unlikely to survive the IC life expectancy and it can be removed from the normal IC distribution channel. However, if an IC were connected to a traditional Zener-based ESD circuit, and if the OVST voltage exceeds the Zener breakdown, the ESD circuit would interfere with, or prevent, the OVST process as it would clamp at or below the OVST voltage level. In contrast, the example embodiment permits application of an OVST voltage level to the IC 104, so long as the OVST voltage level is reached by an ascending voltage level with a slew rate equal to or longer in duration than τ(RC). As a second IC example environment, one time programming (OTP) is a technique where a one-time higher-than-nominal voltage (e.g., 150% of nominal pad/pin voltage) is applied to an IC pad/pin, so as to set a value in the IC. OTP may be used for analog or digital trimming, setting logical functions, storing data or code, and or programming a thick oxide floating gate in a non-volatile memory. Here again, if an IC were connected to a traditional Zener-based ESD circuit, and if the OTP voltage exceeds the Zener breakdown, the ESD circuit would interfere with, or prevent, the intended effect of the OTP. In contrast, the example embodiment permits application of an OTP voltage level to the IC 104, so long as the level is reached by an ascending voltage level with a slew rate equal to or longer in duration than τ(RC).

Figure 5:
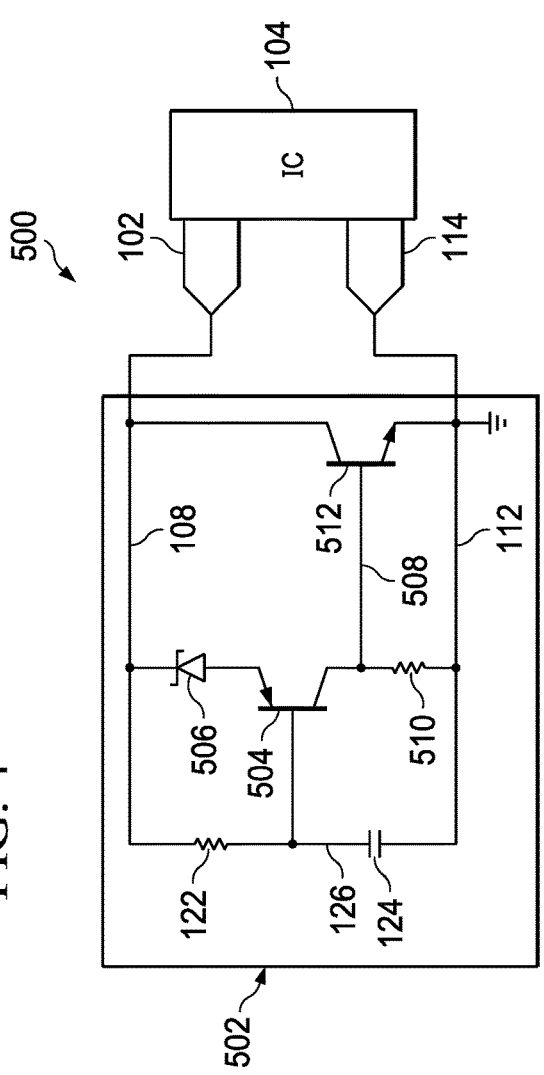
FIG. 5 illustrates an electrical diagram of a first alternative embodiment ESD protection system.

FIG. 5 illustrates an electrical diagram of a first alternative embodiment ESD protection system 500. The ESD protection system 500 includes various of the same components as the FIG. 1 ESD protection system 100, so for those same components like reference numbers are used in both FIGS. 1 and 5. With respect to differences in those systems, the ESD protection system 500 includes an ESD protection circuit 502, which again includes the second resistor 122 and the first capacitor 124, connected between the first node 102 and the low voltage pad 114, and with a second internal node 126 between them. However, the internal node 126 is connected to the base of a PNP bipolar transistor (BJT) 504, which has its emitter connected to an anode of a Zener diode 506 and its collector connected to a fourth internal node 508. The cathode of the Zener diode 506 is connected to the input node 108. The fourth internal node 508 is also connected through a third resistor 510 to the common low potential node 112 and to the base of an NPN BJT 512. The collector of the NPN BJT 512 is connected to the input node 108 the emitter of the NPN BJT 512 is connected to the common low potential node 112.

The operation of the ESD protection system 500 is as shown generally in the steps of the FIG. 2 method 200. More particularly, however, the earlier FIG. 2 discussion detailed those steps regarding the FET operation in the FIG. 1 ESD protection system 100, while regarding FIG. 5 those steps apply to the PNP BJT 504 and the NPN BJT 512.

With respect to the FIG. 2 step 204, as applied to FIG. 5, when the first node 102 signaling is at nominal levels, the PNP BJT 504 has an enabling reverse bias base-to-emitter voltage, but the Zener diode 506 breakdown is not reached at the input node 108, so there is no non-negligible current through the third resistor 510. Accordingly, there is little or no voltage across the third resistor 510, so the voltage at the fourth internal node 508 is negligible and insufficient to provide an enabling forward bias voltage to the base-to-emitter junction of the NPN BJT 512. As a result, relatively little current flows through the ESD protection circuit 502, and the IC 104 operates without material impact from the ESD protection circuit 502.

With respect to the FIG. 2 steps 208, 210, and 212, the FIG. 5 operation also proceeds based on the signal slew rate ascent at the first node 102 when that signal exceeds nominal values. If that slew rate is faster than the τ(RC) of the second resistor 122 and the capacitor 124, then while the PNP BJT 504 is still enabled, the Zener diode 506 breaks down and conducts current through the third resistor 510, creating a voltage across that resistor that forward biases and thereby enables the NPN BJT 512. Accordingly, the enabled NPN BJT 512 shunts the ESD current from the first node 102 to the low potential pad 114. Conversely, if the slew rate is slower than τ(RC), then before the Zener diode 506 breakdown is reached, the RC-charged second internal node 126 charges to a voltage sufficient to disable the PNP BJT 504, thereby isolating the Zener diode 506 anode from a lower potential and preventing the Zener diode 506 from breaking down and conducting current, as the first node 102 signaling continues to ascend. Consequently, as in the step 204, relatively little current flows through the ESD protection circuit 502, and the IC 104 operates without material impact from ESD protect circuit 502.

Figure 6:
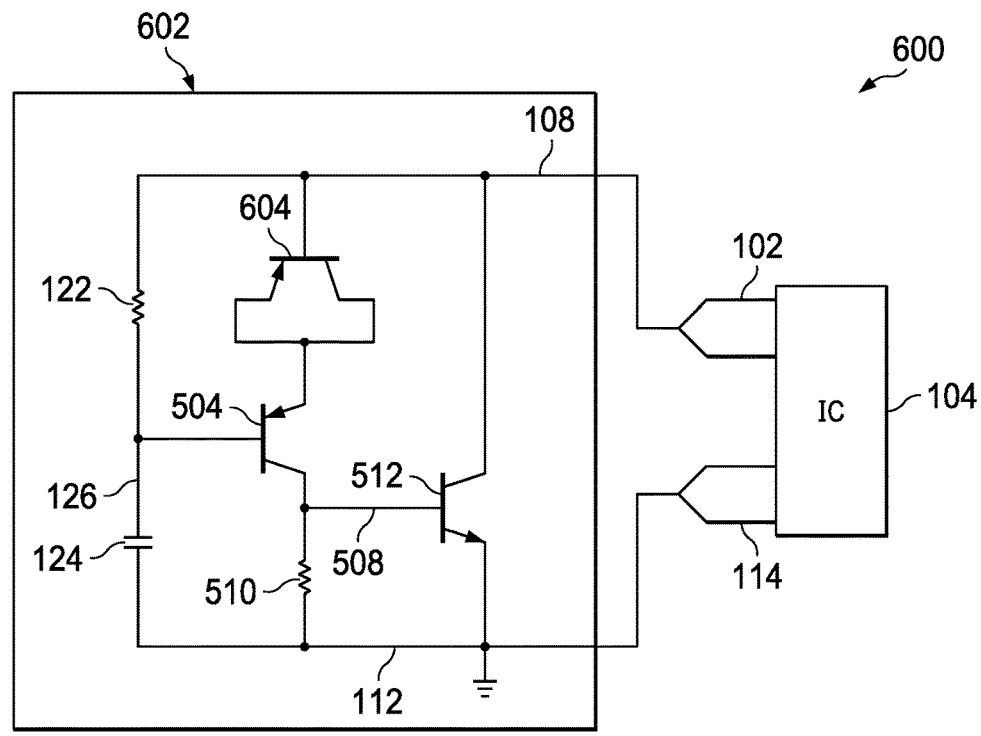
FIG. 6 illustrates an electrical diagram of a second alternative embodiment ESD protection system.

FIG. 6 illustrates an electrical diagram of a second alternative embodiment ESD protection system 600. The ESD protection system 600 includes various of the same components as the FIG. 5 ESD protection system 500, so for those same components like reference numbers are used in both FIGS. 5 and 6. With respect to differences in those systems, the ESD protection system 600 includes an ESD protection circuit 602, which includes the same components as the FIG. 5 ESD protection circuit 502, with the exception that a second PNP BJT 604 is included and the FIG. 5 Zener diode 506 is eliminated. Specifically, the base of the second PNP BJT 604 is connected to the input node 108, and both the collector and the emitter of the second PNP BJT 604 are connected to the emitter of the PNP BJT 504.

The operation of the FIG. 6 ESD protection system 600 is generally the same as the FIG. 5 ESD protection system 500, with the exception that the second PNP BJT 604 can be selected among a PNP configuration that has a base-to-emitter junction with a low breakdown. Accordingly, the low breakdown creates a Zener-like effect, which in the FIG. 6 configuration breaks down when an ESD event occurs at the first node 102, that is, signaling spikes faster than τ(RC) and provides a voltage greater than the breakdown of the second PNP BJT 604 base-to-emitter junction. In contrast, when the voltage at the first node 102 is at or below the IC 104 nominal operational value, the second PNP BJT 604 base-to-emitter junction is reversed bias, so the second PNP BJT 604 does not conduct current to the third resistor 510, so there is insufficient voltage to enable the NPN BJT 512 and the nominal operation of the IC 104 is unaffected by the ESD protection circuit 602. Moreover, if the first node 102 voltage is raised to a level above nominal but at a slew rate slower than τ(RC), then the PNP BJT 504 is disabled prior to a sufficient breakdown voltage being across the second PNP BJT 604 base-to-emitter junction, so that junction has no coupling to a lower potential and is therefore prevented from breaking down. Accordingly, in this condition, operation of the IC 104 is unaffected by the ESD protection circuit 602 and can proceed with certain over-nominal operations (e.g., OVST and OTP).

Figure 7:
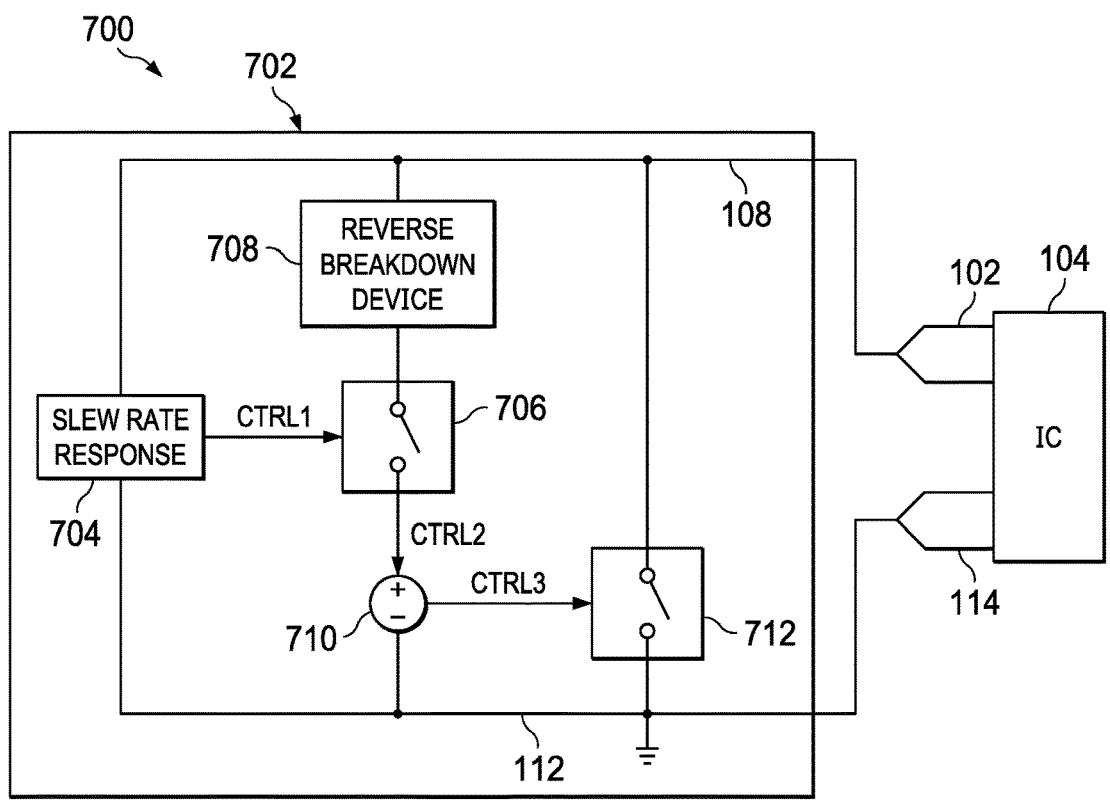
FIG. 7 illustrates an electrical diagram of a third alternative embodiment ESD protection system.

FIG. 7 illustrates an electrical diagram of a third alternative embodiment ESD protection system 700. The ESD protection system 700 illustrates various devices in block or electrical/functional form, consistent with earlier embodiments and as a basis for additional embodiments. Specifically, the ESD protection system 700 again includes the first node 102 (that is ESD protected), the first node 102 and the common low potential pad 114, coupled to an ESD protection circuit 702 that includes the input node 108 and the common low potential node 112. A slew rate response circuit 704 is connected between the input/output pad and the common low potential node 112. The slew rate response circuit 704 is earlier shown, by example, as the series connection of the FIG. 1 second resistor 122 and the capacitor 124. An output of the slew rate response circuit 704 is shown as a first control signal CTRL1 that selectively controls the opening and closing operation of a first switch circuit 706. The first switch circuit 706 is earlier shown, by example, as the FIG. 1 PMOS FET 128, and the FIGS. 5 and 6 PNP BJT 504. The first switch circuit 706 has one terminal connected to a reverse breakdown device 708 and another terminal provides a second control signal CTRL2 to a controllable voltage source 710. The reverse breakdown device 708 is earlier shown, by example, as a PN junction such as the FIG. 1 Zener diode 132, the FIG. 5 Zener diode 506, or the FIG. 6 PNP BJT 604, each of which is further connected to the input node 108 and thus coupled to the first node 102. The controllable voltage source 710 is earlier shown, by example, as the FIG. 1 first resistor 120 or the FIGS. 5 and 6 third resistor 510. The controllable voltage source 710 outputs a third output control signal CTRL3 to a second switch circuit 712. The second switch circuit 712 is earlier shown, by example, as the FIG. 1 NMOS FET 116 and the FIGS. 5 and 6 NPN BJT 512, and is connected between and to selectively couple the input node 108 to the common low potential node 112, in response to CTRL3.

The operation of the ESD protection system 700 is again understood with respect to the FIG. method 200, and in FIG. 7 is shown in block and selective switching form. Accordingly, the IC 104 operates in the step 202, and the step 204 illustrates a response to the condition of signaling at the input node 108 (and the first node 102), while initially CTRL1 selectively controls the first switch circuit 706 to be closed. When the first node 102 signaling is nominal (or below), the reverse breakdown device 708 does not break down, and it and the remainder of the ESD protection circuit 702 present a high impedance to the IC 104, permitting the IC 104 to operate according to its nominal specifications. When an above-nominal event occurs at the first node 102, if it creates a voltage rising faster than τ(RC), then the method 200 proceeds to the step 210 while CTRL1 maintains the first switch 706 closed, and the reverse breakdown device 708 breaks down in response to the fast rising voltage, thereby asserting CTRL2 to control the controllable voltage source 710 to provide an enabling CTRL3 to the second switch circuit 712, thereby selectively closing and shunting current from the first node 102 to the low voltage pad 114. Alternatively, if the voltage at the first node 102 rises above nominal but slower than τ(RC), then the method 200 proceeds to the step 212 where CTRL1 opens the first switch circuit 706, thereby removing a conductive path to ground from the reverse breakdown device 708 so as to prevent it from breaking down. As a result, CTRL2 is de-asserted and the controllable voltage source 710 does not provide an enabling CTRL3 to the second switch circuit 712. With these conditions, the reverse breakdown device 708 does not break down, and it and the remainder of the ESD protection circuit 702 present a high impedance to the IC 104, permitting the IC 104 to operate even with a voltage at the input/output pad above nominal specifications.

The illustrated example embodiments provide selective ESD protection so that an IC may operate in desired or intended over voltage conditions, while still providing IC protecting shunting in an undesirable (e.g., fast slew rate) ESD event. These embodiments may provide various benefits over prior ESD devices. For example, some prior art devices preclude all over-voltage conditions, as such conditions would trigger the ESD shunt so that the excess voltage may not be applied to the IC. As another example, prior approaches with direct capacitive coupling to a shunting (snapback) MOSFET slows down operation of the pad/pin to which the ESD protection applies and can turn on the shunting device at an unintended time. As still another example, certain prior approaches are not feasible for high slew rate ESD events, as a clamping device with a relatively high breakdown voltage may turn off as current diminishes thereby placing the entire breakdown voltage across the pad, causing potential damage to circuitry connected to that pad. The example embodiments improve on one or more of these considerations. Further, while the above-described attributes are shown in combination, the inventive scope includes subsets of one or more features in other embodiments. Still further, also contemplated are changes in various devices, as illustrated by the various described alternative embodiments providing only some examples, with others ascertainable, from the teachings herein, by one skilled in the art. Accordingly, additional modifications are possible in the described embodiments, and other embodiments are possible, within the scope of the following claims.

What is claimed is:

1. An electrostatic discharge protection system, comprising:
   a first signal node adapted to receive a signal;
   a reverse breakdown device coupled to the first signal node and having a PN junction with an N-type portion and a P-type portion;
   a slew rate response circuit coupled to the first signal node;
   a first selectively switched conductive device coupled between the reverse breakdown device and a low potential node adapted to receive a low potential, the P-type portion connected between the N-type portion and the first selectively switched conductive device;
   a controllable voltage source coupled to the first selectively switched conductive device; and
   a second selectively switched conductive device coupled between the first signal node and the low potential node, the second selectively switched conductive device further coupled to receive a controlling voltage from the controllable voltage source.

2. The electrostatic discharge protection system of claim 1 wherein the reverse breakdown device includes a PN junction.

3. The electrostatic discharge protection system of claim 1 wherein the reverse breakdown device includes a Zener diode.

4. The electrostatic discharge protection system of claim 1 wherein the slew rate response circuit includes a series-connected resistor and capacitor.

5. The electrostatic discharge protection system of claim 1 wherein the first selectively switched conductive device includes a PMOS FET.

6. The electrostatic discharge protection system of claim 1 wherein the second selectively switched conductive device includes an NMOS FET.

7. The electrostatic discharge protection system of claim 1:
   wherein the first selectively switched conductive device includes a PMOS FET; and
   wherein the second selectively switched conductive device includes an NMOS FET.

8. The electrostatic discharge protection system of claim 1 wherein the controllable voltage source includes a resistor.

9. The electrostatic discharge protection system of claim 1 wherein the first selectively switched conductive device includes a PNP BJT.

10. The electrostatic discharge protection system of claim 1 wherein the second selectively switched conductive device includes an NPN BJT.

11. The electrostatic discharge protection system of claim 1:
   wherein the first selectively switched conductive device includes a PNP BJT; and
   wherein the second selectively switched conductive device includes an NPN BJT.

12. The electrostatic discharge protection system of claim 1 wherein the reverse breakdown device includes a PNP BJT having a collector and an emitter, wherein the collector is coupled to the emitter.

13. The electrostatic discharge protection system of claim 1 and further including an integrated circuit including the reverse breakdown device, the slew rate response circuit, the first selectively switched conductive device, the controllable voltage source, and the second selectively switched conductive device.

14. The electrostatic discharge protection system of claim 1 and further including an integrated circuit external from the reverse breakdown device, the slew rate response circuit, the first selectively switched conductive device, the controllable voltage source, and the second selectively switched conductive device.

15. An electrostatic discharge protection method, comprising:
   receiving a signal at a first signal node, the first signal node coupled to a reverse breakdown device;
   in response to the received signal having a first slew rate, selectively coupling the reverse breakdown device to a low potential node and discharging the received signal; and
   in response to the received signal having a second slew rate, the second slew rate slower than the first slew rate, selectively de-coupling the reverse breakdown device from the low potential node.

16. The method of claim 15 and further including:
   providing a first impedance between the first signal node and the low potential node in response to the received signal having the first slew rate; and
   providing a second impedance, higher than the first impedance, between the first signal node and the low potential node in response to the received signal having the second slew rate.

17. The method of claim 15 and further including operating an integrated circuit coupled to the first signal node and in response to a voltage at the first signal node greater than a breakdown voltage of the reverse breakdown device.

18. The method of claim 17 wherein the step of operating the integrated circuit includes operating the integrated circuit during the selectively de-coupling step.

19. The method of claim 15 and further wherein the step of selectively coupling includes enabling a discharge device between the first signal node and the low potential node.

20. The method of claim 19 wherein the step of enabling the discharge device is in response to a voltage breakdown of the reverse breakdown device.

21. The method of claim 15 wherein the reverse breakdown device includes a PN junction.

22. The method of claim 15 wherein the reverse breakdown device includes a Zener diode.

23. An integrated circuit, comprising:
   a first signal node adapted to receive a signal;
   a reverse breakdown device coupled to the first signal node;
   a slew rate response circuit coupled to the first signal node;
   a first selectively switched conductive device coupled between the reverse breakdown device and a low potential node adapted to receive a low potential;

a controllable voltage source coupled to the first selectively switched conductive device; and a second selectively switched conductive device coupled between the first signal node and the low potential node, the second selectively switched conductive device further coupled to receive a controlling voltage from the controllable voltage source, wherein the reverse breakdown device includes a Zener diode.

24. An integrated circuit, comprising:

a first signal node adapted to receive a signal;

a reverse breakdown device coupled to the first signal node;

a slew rate response circuit coupled to the first signal node;

a first selectively switched conductive device coupled between the reverse breakdown device and a low potential node adapted to receive a low potential;

a controllable voltage source coupled to the first selectively switched conductive device; and a second selectively switched conductive device coupled between the first signal node and the low potential node, the second selectively switched conductive device further coupled to receive a controlling voltage from the controllable voltage source, wherein the controllable voltage source includes a resistor.

25. An integrated circuit, comprising:

a first signal node adapted to receive a signal;

a reverse breakdown device coupled to the first signal node;

a slew rate response circuit coupled to the first signal node;

a first selectively switched conductive device coupled between the reverse breakdown device and a low potential node adapted to receive a low potential;

a controllable voltage source coupled to the first selectively switched conductive device; and a second selectively switched conductive device coupled between the first signal node and the low potential node, the second selectively switched conductive device further coupled to receive a controlling voltage from the controllable voltage source, wherein the reverse breakdown device includes a PNP BJT having a collector and an emitter, wherein the collector is coupled to the emitter.

26. A method of forming an electrostatic discharge protection circuit, comprising:

connecting a reverse breakdown device to a first signal node adapted to receive a signal, the reverse breakdown device having a PN junction with an N-type portion and a P-type portion;

electrically coupling a slew rate response circuit to the first signal node;

forming a first selectively switched conductive device coupled between the reverse breakdown device and a low potential node adapted to receive a low potential, the P-type portion connected between the N-type portion and the first selectively switched conductive device;

coupling a controllable voltage source to the first selectively switched conductive device; and connecting a second selectively switched conductive device between the first signal node and the low potential node, the second selectively switched conductive device further coupled to receive a controlling voltage from the controllable voltage source.

27. The method of claim 26, wherein the reverse breakdown device includes a Zener diode.

28. The method of claim 26, wherein the controllable voltage source includes a resistor.

29. The method of claim 26, wherein the reverse breakdown device includes a PNP BJT having a collector and an emitter, wherein the collector is coupled to the emitter.

30. The method of claim 26, further comprising connecting an input terminal of an integrated circuit to the first signal node.

* * * * *